United States Patent [19]

Muzyczko et al.

[11] 4,077,806

[45] Mar. 7, 1978

[54] LIGHT SENSITIVE COMPOSITION AND PRODUCTS THEREOF

[75] Inventors: Thaddeus M. Muzyczko, Melrose Park; Donald W. Fieder, Wheaton, both of Ill.

[73] Assignee: The Richardson Company, Des Plaines, Ill.

[21] Appl. No.: 618,990

[22] Filed: Oct. 2, 1975

Related U.S. Application Data

[62] Division of Ser. No. 363,018, May 23, 1973, Pat. No. 3,930,868.

[51] Int. Cl.$^2$ ............... G03C 1/68; G03C 2/78; G08F 1/46; C08F 120/02
[52] U.S. Cl. ............... 96/115 R; 260/326.13 R; 260/332.2 A; 560/51; 96/86 P; 96/87 R; 96/115 P; 204/159.22; 260/29.6; 260/295 T; 260/17.4 R; 260/468 R; 260/29.6 RB; 526/265; 526/304; 526/321; 526/324; 526/329; 526/328 S
[58] Field of Search ............... 96/115 R, 115 P, 86 P, 96/87 R; 204/159.22; 260/29.6 R, 89.5, 476, 17.4, 468, 469, 875, 857, 836, 859, 876; 526/328, 321, 324, 329, 304, 265

[56] References Cited

U.S. PATENT DOCUMENTS

| | | | |
|---|---|---|---|
| 2,367,660 | 1/1945 | Agre | 204/158 |
| 3,725,116 | 4/1973 | Parker et al. | 274/159.22 |
| 3,770,601 | 11/1973 | D'Alelio | 204/159.15 |

Primary Examiner—Jack P. Brammer
Attorney, Agent, or Firm—Alan M. Abrams

[57] ABSTRACT

A light-sensitive composition comprising novel aryl-glyoxyalkyl acrylates that exhibits useful light sensitivity. The basic structure of the new compositions, which may also themselves be polymerized are as follows:

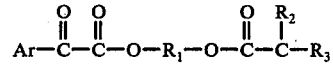

wherein Ar represents an aromatic structure selected from the group consisting of benzene, naphthalene and substituted products of each, $R_1$ represents an alkyl group having from one to ten carbon atoms, $R_2$ represents a grouping selected from the group consisting of hydrogen, or a lower alkyl group having from one to five carbon atoms and $R_3$ represents an alkenyl group having from one to ten carbon atoms and singular unsaturation. The light-sensitive compositions may themselves be utilized in photochemistry as photopolymers, they may be combined with suitable solvents and additives or polymerized with suitable backbone polymers to provide substances which can be used as light-sensitive coatings. These coatings may be placed on substrates and in one instance as presensitized lithographic plates.

20 Claims, No Drawings

LIGHT SENSITIVE COMPOSITION AND PRODUCTS THEREOF

This is a division of application Ser. No. 363,018, filed May 23, 1973 now U.S. Pat. No. 3,930,868.

BACKGROUND OF THE INVENTION

1. Field of the Invention

The field of art to which this invention pertains is light-sensitive compositions and products made therefrom. In particular, the pertinent prior art can be found in those areas dealing with photo-sensitive compositions or photo-sensitive substances made therefrom. Printing or imaging plates in general or presensitized lithographic plate art or photo-sensitive polymeric art will be the most relevant.

2. Description of the Prior Art

Photo-sensitive compounds which are polymeric substances are well known in the art. In particular, these substances can be used in a wide variety of photochemical processes. For example, they can be placed on resilient surfaces and be used for many types of printing plates and particularly for lithography or offset printing, or they can be used for the production of printed circuit boards by chemical milling and etching. The claimed compositions are particularly suitable for use as photopolymers in light-sensitive coatings for lithographic plates or in other systems such as relief plates, general resists, silk screens, etc. They may also be used in printing inks or other light-sensitive coatings.

In a commercial sense, and in particular in the production of lithographic plates, a light-sensitive coating is generally placed on a backing member which in many instances is a metallic substance. A negative or other means to control light exposure to the plate is utilized to selectively cause the areas of the plate struck by a light to become differentially soluble with respect to a solvent, which is subsequently used to flush the non-exposed substance from the backing plate. The image area or the area which has been subjected to light becomes receptive to inks while the non-image area or the area which has not been contacted with light, and which typically has been washed away by a suitable solvent, is not receptive to ink. Therefore, the printing of an object can be accomplished by contacting the developed plate with a particular ink which adheres only to the areas of the plate which have been struck by light. Thereafter, the plate can be contacted with a transfer roll or directly with paper for transfer of ink from the image areas.

Early in the prior art such light-sensitive plates were prepared for immediate use. Because of the nature of the light-sensitive materials utilized their storage or shelf life was substantially reduced when subjected to the atmosphere or to humidity or to extraneous light in relatively small quantities. An improvement over these substances is now known. Many of the presensitized lithographic plates utilized in industry are made of such light-sensitive materials that they are virtually indestructible when contacted with air or moisture, but when contacted with certain wavelengths of the electromagnetic spectrum become substantially instantaneously reacted, thereby rendering a light sensitized product.

The present invention is suitable for use in presensitized lithographic plates or in other areas of photopolymeric chemistry wherein a material which when contacted with certain wavelengths of the electromagnetic spectrum becomes polymerized or insolublized with respect to a solvent and which thereafter can be utilized, for instance in the lithographic plate field, as image-receptive areas. In another instance, the particular photosensitive compounds claimed herein, can be utilized in conjunction with a certain polymeric system so that when contacted with a certain spectrum of electromagnetic radiation the polymeric system can be degraded, thereby rendering a material which can decompose upon contact with light. In particular, the latter application has been of interest in the packaging industry to help reduce littering problems. For instance, such a polymeric system might upon exposure to sunlight become very brittle through a photoreaction enabling it to be more easily weathered by the elements. The use of our particular components in such a polymeric system can allow the container, which when subjected to various quantities or various spectrums of electromagnetic radiation can decompose in a predictable manner, thereby reducing the threat of pollution from containers indiscriminately disposed of.

BRIEF SUMMARY OF THE INVENTION

Our invention can be summarized as a light-sensitive and polymerizable composition comprising an arylglyoxyalkyl acrylate and having the following general structure:

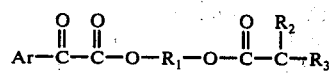

Additionally, our invention can be summarized as a light-sensitive composition comprising repeating arylglyoxyalkyl acrylate substituent units attached to a backbone polymer which substituent units have the following general structure as described below:

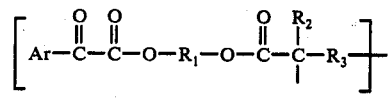

Additionally, our invention can be summarized as a lithographic plate including a support member comprising any resilient material and a film formed from a light-sensitive composition said composition comprising arylglyoxyalkyl acrylate units as described above.

In a broad embodiment, our invention relates to a light-sensitive and polymerizable composition comprising an arylglyoxyalkyl acrylate having the following general structure:

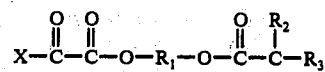

wherein X represents an aromatic selected from the group consisting of benzene, naphthalene and substituted products of each or a heterocyclic such as thiophene and pyrrole, $R_1$ represents an alkyl group having from one to ten carbon atoms, $R_2$ represents a grouping selected from the group consisting of hydrogen, or a lower alkyl group having from one to five carbon atoms and $R_3$ represents an alkenyl group having singular unsaturation and from one to ten carbon atoms.

Another embodiment of our invention resides in a light-sensitive composition comprising repeating arylglyoxyalkyl acrylate substituent units attached to a backbone polymer which substituent units leave the following general structure:

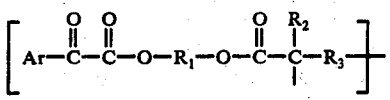

wherein Ar, $R_1$ and $R_2$ are as above and $R_3$ is alkyl group having from one to ten carbon atoms.

Another broad embodiment of our invention relates to a lithographic plate including a support member and a film formed from a light-sensitive composition, said composition comprising repeating arylglyoxyalkyl acrylate units which units have the following general structure:

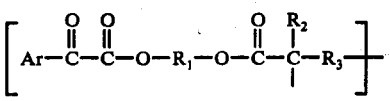

wherein Ar represents an aromatic selected from the group consisting of benzene, naphthalene, and substituted products of each or a heterocyclic, $R_1$ represents an alkyl group having from one to ten carbon atoms, $R_2$ represents a grouping selected from the group consisting of hydrogen or an alkyl group having from one to five carbon atoms and $R_3$ is an alkyl group having from one to ten carbon atoms.

Still another embodiment of our invention is a light-sensitive composition comprising a backbone polymer which has appended from it the following grouping:

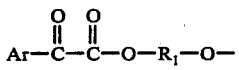

wherein Ar and $R_1$ are as described above.

DETAILED DESCRIPTION OF THE INVENTION

The novel compositions of this invention can generally be characterized as arylglyoxyalkyl acrylates which may be present as individual molecules by themselves or with a suitable binding substance such as a polymeric backbone. When in an unpolymerized state they may be represented by the following formula:

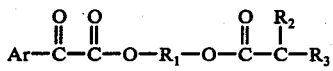

When in a polymerized state prior to light exposure they may be attached to themselves or to a backbone polymeric substance. In the polymerized state and prior to exposure to light they may be represented as follows:

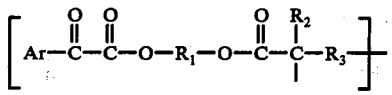

In the above formulas, the aryl component referred to in the general formulas as Ar can be any material of aromatic qualities such as benzene, toluene, xylenes, singular or multiple alkyl or aryl substituted aromatics as well as aryl or alkyl singular or multiple substituted aromatics which may also contain nitrogen, sulfur, hydroxy, carboxylic or carbonyl groups or compounds containing those materials for example, but not necessarily limited to the above listing. Other aromatics such as heterocyclics such as pyrroles, thiophene, phenanthroline, etc., may be used. A particular substitution such as alkoxy on a singular aromatic enhances the light sensitive properties of the above structure. The aromatic grouping may also include such structures as polynuclear aromatic groupings, phenanthrenes, indanes, indenes, the bi-phenols, pyrenes, and other similar type multiple ringed aromatic behaving substances. It is preferred, however, that the aromatic component of the above formulas or any substitution thereon be selected so that it will not adversely or substantially reduce the photosensitive nature the light-sensitive portion of the composition. It is also preferred to choose aromatic structures and substitutions thereon that will not polymerize prior to light exposure so as to maintain the aromatic portion together with the light sensitive portion of the compound as pendent entities when the composition is attached to a backbone polymer.

$R_1$ as defined in the above structure is preferably a simple alkyl group having from about one to about 10 carbon atoms which themselves may be substituted with alkyl, aromatic, alkenyl, halogen or other type substituents such as hydroxy, carbonyl, sulfur, nitrogen, or other substitutable groups. It is preferable, however, that the $R_1$ alkyl group be selected so that it does not adversely affect the light sensitive or the polymerizable portions of the above compound. $R_1$ may also contain amino groupings within the chain itself.

$R_2$ in the above formula can generally be selected from those groups defined as above or the $R_1$ grouping. Specifically, hydrogen or a lower alkyl grouping is preferred as the $R_2$ substituent. Specifically, this substituent should contain materials which will not adversely affect the vinyl bond in the $R_3$ portion of the above formula.

$R_3$ in the structure immediately above is preferably alkyl having from one to 10 carbon atoms. However, when representing $R_3$ in the structural formula for the unpolymerized composition, $R_3$ is alkenyl of from one to 10 carbon atoms and preferably with singular unsaturation. $R_3$ may be substituted with alkyl, aryl, alkenyl or other substitution components. Additionally, amino, carbonyl, hydroxy or other substitutable groupings may be added. It is required that any substitution on the $R_3$ group not prevent it from entering into polymerizing reactions.

The light-sensitive portion of the above compounds is represented by the following arylglyoxyalkyl segment of the claimed composition:

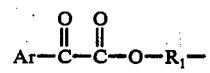

when exposed to actinic light this segment becomes activated causing polymerization at or near the carbonyl groupings. The exact mechanisim is not known but it is observed that exposure to electromagnetic radiation of certain wavelengths will cause the claimed compound to be insoluble to certain solvents. In some instances the alkenyl group may also participate in photolysis. The light-sensitive portion may initiate the polymerizable portion for cross linking.

The portion of the claimed material which is utilized to polymerize the compound to itself or to another monomer on a backbone polymer is represented by the vinyl containing alkyl acrylate segment as shown below:

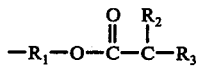

wherein $R_3$ is one carbon atom long. Preferably, prior to contact with light, the claimed compound is polymerized with a monomer or a backbone polymer through this vinyl bond to form a film which can be used in conjunction with a suitable backing plate to form a lithographic plate in one instance.

The arylglyoxyalkyl acrylate components either represented as an unpolymerized molecule or when present in the polymerized state may be used in conjunction with other compounds. In particular, when the arylglyoxyalkyl acrylate is utilized as a substituent structure of a polymerized nature, it may be hung on a backbone polymeric substance by a grafting procedure. Additionally, the arylglyoxyalkyl acrylates of our invention when utilized as polymerized substances may themselves be substituted with monomers similar or identical to the arylglyoxyalkyl acrylates to present a photosensitive polymeric substance. It is contemplated that when the arylglyoxyalkyl acrylates are co-polymerized, that identical arylglyoxyalkyl acrylates may be polymerized in a chain fashion to produce a molecular weight polymer having a desired property. Additionally, arylglyoxyalkyl acrylates which have different substitutions on the aryl, alkyl or alkenyl groupings may be copolymerized, grafted onto a backbone or combined with a monomer having a different structure.

The arylglyoxyalkyl acrylates as described in the claims and in the above formulas may be polymerized with backbone polymeric substances. These backbone structures preferably are organic and may be selected from materials including natural and synthetic resins. Typical backbone materials which contain hydroxyl substitutable components include for example, polyvinyl alcohol, partially hydrolyzed polyvinyl esters such as polyvinyl alcohol-co-vinyl acetate, polyvinyl alcohol co-vinyl benzoate, polyvinyl alcohol co-vinyl acetate co-vinyl benzoate, partially hydrolyzed polyvinyl acetals such as partially hydrolyzed polyvinyl butyral, partially hydrolyzed polyvinyl benzal, partially, hydrolyzed polyvinyl cinnamal as well as mixtures of such partially hydrolyzed acetals, polyethers such as epoxy and phenoxy polymers, etc. Additionally, the condensation product of bisphenol such as diphenylolpropane with epichlorhydrin, naturally occuring materials such as cellulose, starch, guar alginic acid and their partially esterified or etherified derivatives for example, ethyl cellulose, hydroxyethyl cellulose, hydroxylpropyl cellulose, polyesters of polyhydroxy intermediates such as glycerol and sorbitol which have hydroxyl groups remaining after incorporation into the polymeric chain. Additionally, backbone polymers containing reactive amino groups for example, polyvinyl amines, polyaminostyrenes, polyvinyl anthranilates, etc., and polymers containing reactive anhydride groups, for example, copolymers of maleic anhydride with ethylene or styrene. Other backbone structured materials may be utilized which would readily react with the vinyl grouping on the claimed light sensitive compound.

Vinyl groupings may also be used to form a copolymer product with the arylglyoxyalkyl acrylate. Such vinyls can include the ubiquitous styrene or methyl vinyl ether, methylmethacrylate, acrylamide, diacetone acrylamide, vinyl chloride, hydroxy-ethyl acrylate, vinyl pyrrolidone, acrylonitrile derivatives thereof, etc. Other examples of suitable backbone polymers include: the aliphatics such as methylene, ethylene and propylene; the aromatics such as phenylene, biphenylene, naphthalene and anthracene; the substituted aromatics such as toluene, ethylphenylene, aminophenylene, alkoxyphenylenes (e.g. methoxyphenylene), cyanophenylene, hydroxyphenylene, the halophenylenes (e.g. chlorophenylene,) ethylnaphthalene, carboxyphenylene, difunctional derivatives of the phthalates and substituted phthalates such as the hydroxy alkylphthalate compounds (e.g. hydroxyethylphthalate) and acyloxyphenylenes (e.g. acetoxyphenylene); heterocyclics such as difunctional derivatives of cyclopentane, cyclohexane, thiophene and pyrrole; the organometallics such as difunctional derivatives of the metallocenes such as ferrocene; polymeric materials such as polyalkylenes (e.g. polyethylene, polypropylene and polybutylene); polyesters such as polyethyleneterephthalate and polyethyleneadipate; polyurethanes such as the toluene diisocyanate polyol urethanes; polyamides such as polyhexamethyleneadipamide; copolymers such as vinylidene chloride/vinyl chloride copolymers; the polysiloxanes; the polyalkyleneoxides (e.g. polyethylene oxide, polypropylene oxide, polybutylene oxide, polytetramethylene ether and polyepichlorohydrin); the polyalkylene imines such as polyethyleneimine and polypropyleneimine; substituted polyakylenes such as polyvinylpyrrolidone; and phenolic derivatives such as novolac, resole and polyphenylene oxide.

As previously noted, the photoreactive compositions of the present invention can be used alone or in conjunction with other materials to provide photoreactive compositions suitable in a wide variety of photomechanical and photochemical processes. For example, these novel compositions exhibit advantageous utility as photoinitiators with both saturated and unsaturated resins including resins which are not photosensitive in themselves. In particular, durable insoluble photoreaction products can be formed through the conjoint use of the photoreactive compositions of the present invention as photoinitiators with a wide variety of resins, including: the acrylic polymers and acrylic ester resins such as polymethylmethacrylate, polyethylmethacrylate, and copolymers of methyl and butyl methacrylate (e.g. "Elvacite"); polyurethane resins such as those formed from diisocyanates such as, for example, toluene diisocyanate, low molecular weight polyesters and low molecular weight polyethylene glycols (e.g. "Estante" polyurethane resins); blocked urethane resins such as, for example, phenol blocked polyurethane resins (e.g. "Tranco 3A" blocked urethane resins); alkyl celluloses such as ethyl cellulose (e.g. "Hercules K-type" ethyl cellulose); epoxy resins (e.g. "Epon 1004" which is the condensation product formed from bisphenol A and epichlorohydrin); phenoxy resins (e.g. "Bakelite PKHH" phenoxy resin); vinyl acetate/vinyl chloride copolymers (e.g. "Bakelite VYHH" an 86% vinyl chloride, 14% vinyl acetate copolymer medium molecular weight resin); vinyl modified polyethylene such as ethylene/vinyl acetate copolymer containing 2 to 50% vinyl acetate ("Ultrathene" ethylene/vinyl acetate copolymer); partially (5 to 80%) hydrolyzed vinyl acetate); phenolic resins (e.g. "Plenco 1000" novolac resin); acrylamide and modified acrylamide polymers such as diacetone acrylamide homopolymer, N-methylol acrylamide, N-alkoxymethyl acrylamide and partially hydrolyzed acrylamide; water-soluble cellulose derivatives such as the alkoxylated celluloses and hydroxypropyl cellulose (e.g. "Klucel" hydroxypropyl cellulose); and water-soluble polyether resins such as the polyalkylene oxide (e.g. "Polyox WSRN-80" polyethylene oxide).

The exact quantity of the arylglyoxyalkyl acrylate component which may be used as a photosensitive material when combined with other materials such as backbone polymers, other or similar monomers, or solvents, can vary depending upon the degree of photosensitivity desired and the particular solvent or other polymer utilized. Specifically, when the arylglyoxyalkyl acrylates of our invention are utilized with a solvent and placed on a suitable backing plate, the solvent may vary anywhere from about 99 weight percent to about 40 weight percent or lower by weight of the total mixture of solvent and light-sensitive compound. After deposition on the plate, some or most of the solvent can be evaporated leaving a thin film of the arylgyloyxalkyl acrylate which preferably are not polymerized. Upon exposure to an actinic light this film can become insolublized with respect to certain solvents which are used to wash the unpolymerized soluble material from the plate. In some instances, the arylglyoxyalkyl acrylates can be copolymerized with a similar monomer and mixed with a solvent and applied as described above. In other instances, the arylglyoxyalkyl acrylates can be polymerized with another and substantially different structure monomer and then mixed with a solvent and placed on a suitable backing member, again, as described above.

In other instances in which the arylglyoxyalkyl acrylate compounds are hung on a backbone chain, their concentration should be controlled to yield optimum results. Depending upon the molecular weight of the backbone chain and the molecular weight of the arylglyoxyalkyl acrylate pendent molecule, the light-sensitive composition should vary anywhere from about less than one up to about 60 weight percent of the total polymeric mixture. In some instances, the percentage of the light-sensitive compound can vary above or below the above cited ranges since those ranges are disclosed as a general teaching.

The light sensitive segment (arylglyoxyalkyl) of the arylglyoxyalkyl acrylate may itself be substituted in a pendent manner onto a backbone polymer through the alkyl grouping. In such instances the pendent group would have a structure as follows:

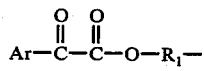

wherein Ar is an aryl or a heterocyclic aromatic and $R_1$ is an alkyl group having from one to 10 carbon atoms.

Also, the light-sensitive compound which is polymerized with a monomer or a backbone polymer may be mixed with suitable solvents in varying concentrations and applied to a suitable backing plate. The quantity of solvent and polymer can be varied to meet performance standards as mentioned previously. Suitable solvents which can be utilized to lay the claimed composition upon a suitable backing plate are known in the art and are not critical in adquately describing our invention. Typical solvents which can be utilized, include methyl-ethyl ketone and relatively inert aromatic hydrocarbons.

The light-sensitive composition when placed upon a suitable backing plate with a solvent or grafted onto a backbone polymer or copolymerized with itself, a similarly structured arylglyoxyalkyl acrylate or, a similar monomer is sensitive to actinic light and especially to ultraviolet radiation having wavelengths up to about 4,000 angstrom units. With suitable sensitizers, which are well known in the art, the range of sensitivity of the particular component to light can be extended. Specific sensitizers are known in the art and their detailed description is not necessary in order to appreciate the claimed invention. Other additives such as dyes, plasticizers, etc., may be used as needed and commonly known in photosensitive plate technology.

Preparation of the arylglyoxyalkyl acrylate materials can involve a synthesis of phenylglyoxylic acid with anyone of a number of acrylic compounds having hydroxy groupings.

In particular, preparation of the claimed compounds specifically can include the condensation reaction of phenylglyoxylic acid and 2-hydroxyethyl methacrylate. These two materials are reacted, water is driven off and the resultant phenylglyoxyethyl methacrylate is produced. In producing the hydroxy substituted acrylate, an unsaturated acid can be reacted with a cyclic ether, preferably of low molecular weight, to form the resulting hydroxy substituted acrylate. The substituted acrylate can then be reacted with a phenylglyoxylic acid to produce a product claimed herein.

To produce the hydroxy substituted acrylate, ethylene oxide can be combined with methacrylic acid to form 2-hydroxyethyl methacrylate. The resultant methacrylate can then be reacted with phenyl glyoxylic acid to form a particular arylglyoxyalkyl acrylate claimed by us.

Other unsaturated acids similar to acrylic or methacrylic acid may be utilized to be combined with certain cyclic ethers to provide the hydroxy substituted acrylate which when combined with the phenylglyoxylic acid can produce the compound claimed by us. Other such unsaturated acids include crotonic acid, preferably other relatively linear unsaturated acids in which the vinyl bond appears once in the alkenyl chain connected to the carboxylic group. Other cyclic ethers may be used in the synthesis of the hydroxy substituted acrylate. Examples include higher homologs of ethylene oxide.

By varying the particular unsaturated acids and cyclic ethers used to produce the hydroxy substituted acrylate, the $R_1$ and $R_2$ groupings of the claimed compound or polymer units can be varied to encompass the scope of the claimed subject matter.

A light-sensitive polymer composition according to the claims attached may also be prepared by an emulsion polymerization process. For example, the arylglyoxyethyl acrylate may be homo or copolymerized, using a suitable emulsifying surfactant and an initiator. Further, the emulsion particles may contain additives such as dyes, pigments, sensitizers, plasticizers, etc. Alternatively, the aqueous phase may contain water soluble polymers and other additive materials. The advantages of light-sensitive polymers produced by the emulsion polymerization step are listed below:

(1) High molecular weights can be produced at low coating viscosities which should result in a fewer photo-induced cross-links being necessary for photo-insolubilizations;

(2) Water may be used as the dispersing medium which could, in many instances, eliminate the solvent hazards associated with non-aqueous solvents, such as toluene or xylene;
(3) Inherent stability as compared to prior art non-emulsion polymerization processes;
(4) Simplicity of use as compared to other systems;
(5) Water development may be used in some cases reducing the need for solvent washes using expensive or dangerous solvents;
(6) Micro-mixes with other emulsion polymers may be made easily and quickly to achieve a wide range of physical and photosensitive properties;
(7) Thicker coatings can be applied easily if greater relief is desired.

Emulsion polymer latex particles can range anywhere from 100 angstroms to micron sizes in diameter. Suitable techniques for the preparation of emulsion polymers may be found in the prior art. In particular, Preparative Methods of Polymer Chemistry, InterScience Publishers, New York 1968, Second Edition, by W. R. Sorenson and T. R. Campbell, presents adequate teachings for such processing techniques.

The following examples are presented to specifically illustrate one embodiment of our invention and are not to be read so as to unduly limit the scope of the appended claims.

EXAMPLE I

Synthesis of Phenylglyoxyethyl Methacrylate 50 grams (0.333 moles) of phenylglyoxylic acid (Aldrich No. B1305-5 and, Matheson, Coleman, and Bell No. PX 765,P9432), 52.3 grams (0.40 moles) 2-hydroxyethyl methacrylate (Eastman P8366) which contained approximately 84% hydroxyethyl methacrylate according to gas chromatographic measurements, and 700 milliliters of benzene were charged into a one liter one neck flask. A Dean-Stark trap and water condenser were fitted to the flask. The reaction mixture was then refluxed 25 hours and 24 minutes after which 4.5 milliliters of water was collected. The cooled light green solution recovered was washed five times with 250 milliliters of a 10 percent by weight $NaHCO_3$ solution. The basic material was dried over $Na_2SO_4$ and stripped on a flash evaporator at less than 40° C to constant weight. 53.2 grams of light yellow liquid was recovered. 45.3 grams of the light yellow liquid was placed in a separatory funnel to which 500 milliliters of carbon tetrachloride was added and washed ten times with 250 milliliters of tap water. The washed material was dried over $Na_2SO_4$. The material was then filtered and stripped on a flashed evaporator at less than 45° C. The filtered material was a yellow liquid and weighed 15.8 grams. Upon examination of this material by infra-red spectrographic analysis it was determined that the synthesis of phenylglyoxyethyl methacrylate had been performed.

EXAMPLE II

Light Sensitivity Testing

A solution of three grams of the end product of Example I plus 97 grams of a 50—50% mixture of methylethyl ketone and acetone was prepared. The solution was coated on an aluminum brush grained plate two times. The plate was exposed ten minutes to pulsed xenon ligh through a step wedge. The exposed plate was then developed with a sodium silicate solution. Small print on the step wedge was clear. Under the same conditions, starting (reacted) materials utilized in Example I (phenylglyoxylic acid) gave poor results.

EXAMPLE III

Light Sensitivity with a Sensitizer

A solution was prepared containing 0.3 grams of benzoin, 2.7 grams of phenylglyoxyethyl methacrylate from Example I and 97 grams of 50—50 mixture of methylethyl ketone and acetone. The solution was mixed and coated on an aluminum brush grained plate by dipping the plate in the solution. The plate was exposed 10 minutes to pulsed xenon light through a step wedge. The plate was developed with a sodium silicate solution. Numbers 15 through 21 on the step wedge came out sharp and clear after developing.

EXAMPLE IV

Preparation of a Relief Plate

A three square inch brushed grained aluminum plate was coated with the product of Example I (phenylglyoxyethyl methacrylate). The monomer was first wiped on with lithograph pad material and then put on with a dropper. Although a uniformly thick coating was not insured with this procedure it was only desired to place a workable thickness of the phenylglyoxyethyl methacrylate upon the aluminum plate to test its use as a relief plate. An aluminum sheet into which a design had been cut was placed over the coated plate and was somewhat raised from the plate to prevent contact therewith. The unit was exposed to ultraviolet light for 2 hours. The exposed plate was washed with a sodium silicate solution and then with methylethyl ketone to remove unexposed, soluble areas. An adherent plastic coating was obtained in the exposed areas. The color of the coating was a light greenish-yellow. There apparently was not much if any discoloration of the polymerized material from the starting monomer.

EXAMPLE V

Relief Printing Plate Preparation

A three by three inch brushed grained aluminum plate was coated by repeated application and evaporation of a clear solution comprising 2 grams of the phenylglyoxyethyl methacrylate product of Example I, 0.4 grams of xanthene-9-one, and 25 grams of methylethyl ketone. The plate was exposed and developed as described in Example IV. The color of the exposed and hardened material was light green and light green-yellow. Again, there was not much apparent discoloration of the exposed monomer. A micrometer was used to measure the thickness of the polymer coating. The coating was found to be approximately 0.01 inches thick.

We claim:

1. A light sensitive polymer prepared by homo or copolymerization of a compound having the following general structure:

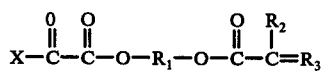

wherein X represents an aromatic or a heterocyclic structure, $R_1$ represents an alkylene group having from one to ten carbon atoms, $R_2$ represents a grouping selected from the group consisting of hydrogen and lower alkyl having from one to five carbon atoms, and $R_3$ represents an alkenyl group having from one to ten carbon atoms.

2. A light sensitive composition comprising an effective amount of a polymer which includes as a recurring structure:

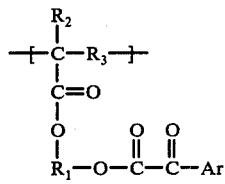

wherein Ar represents an aromatic selected from the group consisting of phenyl, naphthyl and substituted products of each, $R_1$ represents an alkylene group having from one to ten carbon atoms, $R_2$ represents a grouping selected from the group consisting of hydrogen and lower alkyl having from one to five carbon atoms, and $R_3$ represents an alkylene group having from one to ten carbon atoms.

3. The composition of claim 2 wherein Ar is phenyl.

4. The composition of claim 2 wherein $R_1$ has two carbon atoms.

5. The composition of claim 2 wherein $R_2$ has one carbon atom.

6. The composition of claim 2 wherein Ar is phenyl, $R_1$ has two carbon atoms and $R_2$ has one carbon atom.

7. The composition of claim 2 wherein said polymer comprises from about 0.1 up to about 100% by weight of the total light sensitive composition.

8. The composition of claim 2 wherein $R_3$ has one carbon atom.

9. A light sensitive plate including a support member and a film formed from a light sensitive composition, said composition comprising an effective amount of a polymer which includes as a recurring structure:

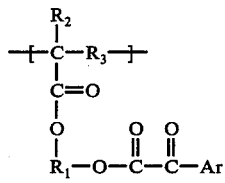

wherein Ar represents an aromatic selected from the group consisting of phenyl, naphthyl and substituted products of each, $R_1$ represents an alkylene group having from one to ten carbon atoms, $R_2$ represents a grouping selected from the group consisting of hydrogen and lower alkyl having from one to five carbon atoms, and $R_3$ represents an alkylene group having from one to ten carbon atoms.

10. The light sensitive plate of claim 9 wherein Ar is phenyl.

11. The light sensitive plate of claim 9 wherein $R_1$ has two carbon atoms.

12. The light sensitive plate of claim 9 wherein $R_2$ has one carbon atom.

13. The light sensitive plate of claim 9 wherein Ar is phenyl, $R_1$ has two carbon atoms and $R_2$ has one carbon atom.

14. The light sensitive plate of claim 9 wherein said film includes said light sensitive composition grafted to a polymeric material.

15. The light sensitive plate of claim 9 wherein $R_3$ has one carbon atom.

16. A light sensitive composition comprising an effective amount of a copolymer of a monomer and an arylglyoxyalkyl acrylate, said copolymer including as a recurring structure:

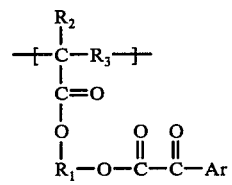

wherein Ar represents an aromatic selected from the group consisting of phenyl, naphthyl and substituted products of each, $R_1$ represents an alkylene group having from one to ten carbon atoms, $R_2$ represents a grouping selected from the group consisting of hydrogen and lower alkyl having from one to five carbon atoms, and $R_3$ represents an alkylene group having from one to ten carbon atoms.

17. The composition of claim 16 wherein said vinyl is selected from the group consisting of styrene, methyl vinyl ether, methylmethacrylate, acrylamide, diacetone acrylamide, vinyl chloride, hydroxy ethyl acrylate, vinyl pyrrolidone, acrylonitrile and derivatives thereof.

18. The composition of claim 16 which also includes a sensitizer selected from the group consisting of Michler's ketone, benzoin, parachlorobenzaldehyde, acetophenone and derivatives thereof.

19. A light sensitive composition comprising an effective amount of a polymer having as a recurring structure:

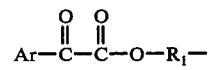

wherein Ar represents an aromatic selected from the group consisting of phenyl, napthyl and substituted products of each, and $R_1$ represents an alkylene group having from one to ten carbon atoms.

20. The composition of claim 19 wherein said recurring structure is attached as pendant groups to the backbone of said polymer, said polymer backbone being selected from the group consisting of acrylates, epoxys, urethanes and maleic anhydride polymers.

* * * * *

UNITED STATES PATENT AND TRADEMARK OFFICE
CERTIFICATE OF CORRECTION

PATENT NO. : 4,077,806
DATED : March 7, 1978
INVENTOR(S) : Thaddeus M. Muzyczko and Donald W. Fieder It is certified that error appears in the above-identified patent and that said Letters Patent are hereby corrected as shown below:

Column 7, line 67, "adquately" should read --adequately--

Column 9, line 68, "ligh" should read --light--

Column 12, line 14, "a monomer" should read --a vinyl monomer--

Signed and Sealed this

Third Day of April 1979

[SEAL]

Attest:

RUTH C. MASON
Attesting Officer

DONALD W. BANNER
Commissioner of Patents and Trademarks